(12) United States Patent
Moriya et al.

(10) Patent No.: US 8,256,441 B2
(45) Date of Patent: Sep. 4, 2012

(54) METHOD FOR CLEANING OPTICAL ELEMENT OF EUV LIGHT SOURCE DEVICE AND OPTICAL ELEMENT CLEANING DEVICE

(75) Inventors: Masato Moriya, Tokyo (JP); Yoshifumi Ueno, Tokyo (JP); Tamotsu Abe, Tokyo (JP); Akira Sumitani, Tokyo (JP)

(73) Assignee: Gigaphoton Inc., Tochigi-Ken (JP)

( * ) Notice: Subject to any disclaimer, the term of this patent is extended or adjusted under 35 U.S.C. 154(b) by 795 days.

(21) Appl. No.: 12/148,969

(22) Filed: Apr. 24, 2008

(65) Prior Publication Data
US 2010/0025231 A1 Feb. 4, 2010

(30) Foreign Application Priority Data
Apr. 27, 2007 (JP) ................. 2007-119110

(51) Int. Cl.
- B08B 3/00 (2006.01)
- B08B 3/12 (2006.01)
- B08B 6/00 (2006.01)
- A61N 5/06 (2006.01)
- G01J 3/10 (2006.01)
- H05G 2/00 (2006.01)

(52) U.S. Cl. ............ 134/186; 134/184; 250/504 R
(58) Field of Classification Search ............ 134/184, 134/186; 250/504 R
See application file for complete search history.

(56) References Cited

U.S. PATENT DOCUMENTS

| | | | |
|---|---|---|---|
| 6,377,651 B1 * | 4/2002 | Richardson et al. | 378/34 |
| 7,247,870 B2 | 7/2007 | Ershov et al. | |
| 2002/0094063 A1 * | 7/2002 | Nishimura et al. | 378/119 |
| 2007/0228303 A1 * | 10/2007 | Fujimoto | 250/505.1 |
| 2008/0087847 A1 * | 4/2008 | Bykanov et al. | 250/504 R |

FOREIGN PATENT DOCUMENTS

| | | |
|---|---|---|
| EP | 1775755 A1 * | 4/2007 |
| JP | H10-64864 | 3/1998 |
| JP | H11-297595 | 10/1999 |
| JP | 2004207740 | 7/2004 |
| JP | 2005-235959 | 9/2005 |
| JP | 2007-13054 | 1/2007 |
| JP | 2007-119110 | 5/2007 |
| JP | 2008-532231 | 8/2008 |
| WO | WO 2004092693 A2 * | 10/2004 |
| WO | WO 2006/093781 | 9/2006 |

OTHER PUBLICATIONS

Refusing Reason Notice for related Patent Application No. 2007-119110 dated Mar. 13, 2012.
Yoshifumi Ueno et al. "Characterization of Various Sn Targets with Respect to Debris and Fast Ion Generation" Proceedings of SPIE, Mar. 2007, vol. 6517, pp. 65173B.
Japanese Patent Office Notice dtd Dec. 20, 2011 for related JP Patent Application No. 2007-119110.

* cited by examiner

*Primary Examiner* — Michael Barr
*Assistant Examiner* — Charles W Kling
(74) *Attorney, Agent, or Firm* — Husch Blackwell LLP

(57) ABSTRACT

A method for cleaning an optical element of an extreme ultraviolet light source device for removing, from the optical element in a chamber, scattered matter generated together with extreme ultraviolet light by plasma formed through laser beam excitation of a target in the chamber, the method which comprises: making the scattered matter generated by the plasma no larger than nanosize by using solid tin as the target and using a $CO_2$ laser as an excitation source of the solid tin; and imparting, to the scattered matter no larger than the nanosize adhered to the optical element, an effect of overcoming the adherence of the scattered matter.

6 Claims, 15 Drawing Sheets

METHOD FOR CLEANING OPTICAL ELEMENT OF EUV LIGHT SOURCE DEVICE AND OPTICAL ELEMENT CLEANING DEVICE

BACKGROUND

1. Technical Field

The present invention relates to an optical element cleaning method, and an optical element cleaning device, for cleaning an optical element having adhered thereon scattered material, generated together with EUV (extreme ultraviolet) light, in an EUV light source device employed as a light source in exposure apparatuses.

2. Related Art

In the wake of ever finer semiconductor processing in recent years, features are quickly becoming finer as well in photolithography. Fine processing requirements are moving from the 100 nm to the 70 nm node, and beyond, to the 50 nm node, in next-generation applications. To meet the requirements of fine processing at the 50 nm node or less, for instance, exposure apparatuses being developed are expected to combine an EUV light source having a wavelength of about 13 nm with a reducing projection reflective optical system (catadioptric system).

There are three types of EUV light sources: LPP (laser produced plasma) light sources, using plasma generated through irradiation of a laser beam onto a target (referred to hereinafter as "LPP-type EUV light source devices"), DPP (discharge produced plasma) light sources, using plasma generated by discharge, and SR (synchrotron radiation) light sources, using synchrotron orbital radiation. Among these, LPP light sources afford extremely high brightness, close to black body radiation, since they allow increasing plasma density to a substantial degree. Also, selection of the target substance affords light emission in a required wavelength alone. Among other advantages, LPP light sources have moreover a substantially isotropic angular distribution, so that an extremely large capture steric angle, of $2\pi$ steradian, can be achieved without structures such as electrodes or the like on the periphery of the light source. Accordingly, such LPP light sources are expected to become prevailing in light sources for EUV lithography in which a power of several tens of watts or greater is required.

The principle of EUV light generation by LPP is explained next. A laser beam is irradiated onto a target substance supplied into a vacuum chamber, to excite thereby the target substance into plasma. Such plasma emits various wavelength components that include EUV light. An EUV collector mirror for selectively reflecting a desired wavelength component (for instance, a component having a 13.5 nm wavelength) is arranged in the vacuum chamber. The EUV collector mirror reflects and condenses EUV light, and outputs the EUV light into the exposure apparatus. As the target substance there may be used, for instance, tin (Sn), lithium (Li), xenon (Xe) or the like. Among these, tin (Sn) is a promising target substance thanks to the high EUV conversion efficiency that it affords. On the reflective surface of the EUV collector mirror there is formed, for instance, a multilayer film obtained by alternately layering a molybdenum (Mo) thin film and a silicon (Si) thin film (Mo/Si multilayer film).

In such an LPP-type EUV light source device, the influence of neutral particles and/or ions emitted from the plasma and target becomes problematic, in particular, when using a solid target. The EUV collector mirror 15 is arranged in the vicinity of the plasma, and hence neutral particles emitted from the plasma and target become adhered to the reflective surface of the EUV collector mirror, impairing the reflectance of the mirror. Meanwhile, the ions emitted by the plasma erode the multilayer film formed on the reflective surface of the EUV collector mirror (this phenomenon is referred to as "sputtering" in the present application). In the present description, contamination refers to the negative effect exerted on optical elements by such neutral particles and ions. Also, the term debris refers to the scattered matter from the plasma, and includes neutral particles and ions, as well as remnants of the target substance.

In order to maintain a high reflectance in the EUV collector mirror, the latter must exhibit high surface flatness, for instance of about 0.2 nm (rms), which is extremely expensive. As a result, frequent replacement of the EUV collector mirror incurs not only longer maintenance downtime but also increased operative costs. Prolonging the life of the EUV collector mirror would be thus desirable in terms of, for instance, reducing the operative costs of the exposure apparatus and of shortening maintenance downtime. The mirror life in an EUV light source device for exposure is defined as the period of time elapsed until a drop of reflectance of, for instance, 10%. Such mirror life must be at least one year.

As described above, a metallic film forms on the surface of the EUV collector mirror through debris adhesion. The metallic film absorbs EUV light, thereby reducing the reflectance of the EUV collector mirror. A hypothetical light transmissivity of the metallic film of about 95% would result in a reflectance of about 90% in the EUV collector mirror. To achieve an EUV collector mirror life of one year or more, the loss of reflectance of the EUV collector mirror for EUV light having a wavelength of 13.5 nm must be no greater than 10%. Consequently, the tolerance for the adhesion amount (thickness) of metal on the reflective surface of the EUV collector mirror is extremely small, of about 5 nm for lithium and of about 0.75 nm for tin.

Debris adheres not only to the EUV collector mirror but also to any components in the chamber. In particular, the output of the EUV light source device increases when debris adheres to the optical elements provided in the optical path of laser beams and/or of the EUV light. Adhesion of debris impairs also the sensitivity of any sensors or the like that may be provided on the optical elements. To prevent such occurrences, thus, the metallic film must be removed periodically from the optical elements in the chamber.

However, the debris particles that form the metallic film have substantial adherence, and hence it has been impossible to fully remove debris from the optical elements, even when subjecting the debris adhered to the optical elements to physical cleaning. Such being the case, US Patent Application Publication No. 2007/0018122 discloses a technology for removing debris from an optical element by subjecting debris adhered to the optical element to a chemical cleaning action and/or a thermal cleaning action.

US Patent Application Publication No. 2007/0018122 discloses a technology of preventing debris from adhering to a chamber window by covering the window with a calcium fluoride and/or magnesium fluoride shield that is itself cleaned. Specifically, the shield is cleaned through chemical etching of the shield surface, using gas and/or plasma, or by causing debris to detach from the shield surface by heating the shield itself to liquefy or vaporize the debris adhered to the shield surface.

As described above, tin (Sn) is a promising target substance thanks to the high EUV conversion efficiency that it affords.

The etching method described in US Patent Application Publication No. 2007/0018122 employs a gas such as hydrogen bromide (HBr), chlorine ($Cl_2$) or the like, or an etchant of the foregoing excited into plasma, for cleaning tin debris. Such a method, however, has the following problems when employed for cleaning an EUV collector mirror. A Mo/Si multilayer film is formed on the reflective surface of the EUV collector mirror. Upon etching of the EUV collector mirror in accordance with the etching method described in US Patent Application Publication No. 2007/0018122, not only the metallic film on the reflective surface, but the reflective surface itself, i.e. the Mo/Si film, becomes etched as well. In addition to impairing as a result the flatness of the EUV collector mirror, this shortens also the life of the EUV collector mirror.

The method for vaporizing debris described in US Patent Application Publication No. 2007/0018122 entails the following problems. To vaporize, for instance, tin debris, the optical element itself must be heated to a temperature of 300° C. or above. The reflective surface and transmission surface of optical elements are covered with various coating substances. Herein, heating the optical element to a temperature of 300° C. or above gives rise to fatigue breakdown on account of differences in the coefficients of thermal expansion of the coating materials, and/or thermal diffusion among coating substances, all of which impair reflectance and/or transmissivity.

Conventional cleaning methods, therefore, have failed to prolong the usable life of EUV collector mirrors by preserving the original reflectance and transmissivity of the optical element over long periods of time.

In light of the above, it is an object of the present invention to solve the problem of extending the usable life of an optical element by making it possible to remove, from the surface of an optical element, debris generated together with EUV light by plasma formed through laser beam excitation of a target in a chamber, without damaging the optical element provided in the chamber.

SUMMARY

A first aspect of the present invention provides a method for cleaning an optical element of an extreme ultraviolet light source device for removing, from the optical element in a chamber, scattered matter generated together with extreme ultraviolet light by plasma formed through laser beam excitation of a target in the chamber, the method comprising: making the scattered matter generated by the plasma no larger than nanosize by using solid tin as the target and using a $CO_2$ laser as an excitation source of the solid tin; and imparting, to the scattered matter no larger than the nanosize adhered to the optical element, an effect of overcoming the adherence of the scattered matter.

A second aspect of the present invention provides an optical element cleaning device for an extreme ultraviolet light source device for removing, from the optical element in a chamber, scattered matter generated together with extreme ultraviolet light by plasma formed through laser beam excitation of a target in the chamber, wherein solid tin is used as the target, a $CO_2$ laser is used as an excitation source of the solid tin, and the optical element cleaning device comprises cleaning means for imparting, to nanosize scattered matter adhered to the optical element generated by plasma formed through excitation of the solid tin by the $CO_2$ laser, an effect of overcoming the adherence of the scattered matter.

A third aspect of the present invention provides the optical element cleaning device for an extreme ultraviolet light source device as claimed in the second aspect of the present invention, wherein the cleaning means has wiping means for wiping off the nanosize scattered matter adhered to the optical element.

A fourth aspect of the present invention provides the optical element cleaning device for an extreme ultraviolet light source device as claimed in the second aspect of the present invention, wherein the cleaning means has sputtering means for removing, by sputtering, the nanosize scattered matter adhered to the optical element.

A fifth aspect of the present invention provides the optical element cleaning device for an extreme ultraviolet light source device as claimed in the second aspect of the present invention, wherein the cleaning means has laser light irradiation means for irradiating laser light onto the nanosize scattered matter adhered to the optical element, and detaching the scattered matter from the optical element by way of thermal shockwaves generated by irradiating laser light onto the scattered matter.

A sixth aspect of the present invention provides the optical element cleaning device for an extreme ultraviolet light source device as claimed in the second aspect of the present invention, wherein the cleaning means has: water supply means for supplying water to the nanosize scattered matter adhered to the optical element; and laser light irradiation means for irradiating laser light onto the scattered matter containing water and vaporizing the scattered matter and the water.

A seventh aspect of the present invention provides the optical element cleaning device for an extreme ultraviolet light source device as claimed in the second aspect of the present invention, wherein the cleaning means has gas jetting means for jetting an inert gas onto the nanosize scattered matter adhered to the optical element, and detaching the scattered matter from the optical element by way of a jetting pressure of the inert gas.

An eighth aspect of the present invention provides the optical element cleaning device for an extreme ultraviolet light source device as claimed in the second aspect of the present invention, wherein the cleaning means has particle jetting means for jetting particles onto the nanosize scattered matter adhered to the optical element, and detaching the scattered matter from the optical element by way of a jetting pressure of the particles.

A ninth aspect of the present invention provides the optical element cleaning device for an extreme ultraviolet light source device as claimed in the second aspect of the present invention, wherein the cleaning means has liquid filling means for filling the chamber with liquid, and removing the nanosize scattered matter adhered to the optical element by way of the liquid.

A tenth aspect of the present invention provides the optical element cleaning device for an extreme ultraviolet light source device as claimed in the second aspect of the present invention, wherein the cleaning means has liquid jetting means for jetting liquid onto the nanosize scattered matter adhered to the optical element, and detaching the scattered matter from the optical element by way of a jetting pressure or detergency of the liquid.

An eleventh aspect of the present invention provides the optical element cleaning device for an extreme ultraviolet light source device as claimed in the second aspect of the present invention, wherein the cleaning means has vibration means for vibrating the optical element and detaching, from the optical element, the nanosize scattered matter adhered to the optical element.

A twelfth aspect of the present invention provides the optical element cleaning device for an extreme ultraviolet light source device as claimed in the second aspect of the present invention, wherein the optical element comprises a transmissive protective plate, provided between a plasma generation region and another optical element in such a way so as to cover the other optical element, for preventing scattered matter from adhering to the other optical element.

In the EUV light source device of the present invention, solid tin is used as a target, and a $CO_2$ laser is used as a target excitation source, such that the debris generated by plasma formed through excitation of the solid tin (Sn) by a laser beam outputted by the $CO_2$ laser has a size no greater than nanosize, as a result of which the nanosize debris adhered to the optical element is imparted the effect of overcoming debris adherence.

The inventors found that much of the plasma-generated debris during excitation of solid tin by a $CO_2$ laser ranges from sub-nano to nanosize (molecular/atomic level). This phenomenon was unknown heretofore. Overcoming microsize debris adherence is difficult, but overcoming the adherence of sub-nano to nanosize debris is relatively easy.

The adherence of sub-nano to nanosize debris can be overcome by, for instance, wiping off the debris on the optical element surface, sputtering the debris on the optical element surface, generating thermal shockwaves through irradiation of laser light onto the debris on the optical element surface, wetting the debris on the optical element surface and vaporizing the debris together with the moisture, blowing a gas, fluid or liquid onto the debris on the optical element surface, cleaning the debris on the optical element surface using a cleaning solution, or imparting vibration to the debris on the optical element surface.

In the present invention, the debris generated by the plasma resulting from exciting a solid tin target with a $CO_2$ laser is nanosize debris. The adherence of nanosize debris is very weak and is thus easy to overcome. Therefore, the nanosize debris can be removed from the optical element by subjecting the nanosize debris adhered to the optical element to the action of such forces or energy that can overcome that adherence. The usable life of the optical element can thus be prolonged as a result.

DETAILED DESCRIPTION

Embodiments of the present invention are explained below with reference to accompanying drawings.

Before explaining the various embodiments of the present invention, the basic constitution of an EUV light source device according to the present invention will be explained first with reference to FIG. 1. All the below-described embodiments include the constitution explained using FIG. 1.

Figure 1:
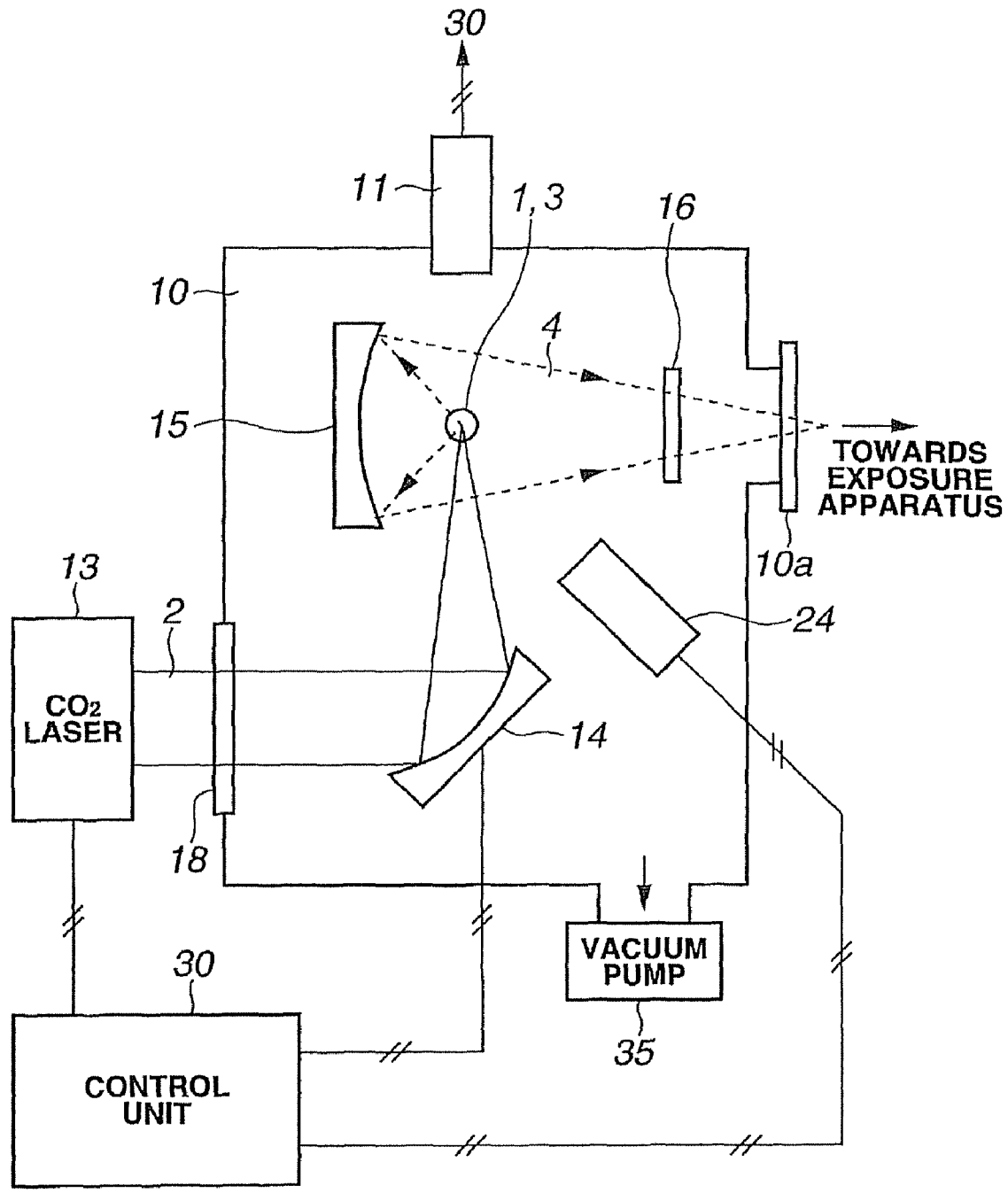
FIG. 1 is a diagram illustrating the basic constitution of an EUV light source device according to the present invention.

FIG. 1 is a diagram illustrating the basic constitution of an EUV light source device according to the present invention; The EUV light source device according to the present invention utilizes laser produced plasma (LPP), wherein EUV light is generated through excitation by laser beam irradiation.

As illustrated in FIG. 1, the EUV light source device comprises a vacuum chamber 10 where EUV light 4 is generated; a $CO_2$ laser 13 for generating an excitation laser beam 2 that is irradiated onto a Sn target 1; a laser condensing optical system 14 for condensing the excitation laser beam 2 generated by the $CO_2$ laser 13; an EUV collector mirror 15 for condensing and outputting the EUV light 4 emitted by plasma 3 that is generated through irradiation of the excitation laser beam 2 onto the Sn target 1; an SPF 16 (having as a material thereof any among Zr, Si, or Mo), for letting through, towards an exposure apparatus, EUV light of a certain wavelength; and a control unit 30 for controlling the EUV light source device as a whole.

A laser input window 18 (having as a material thereof any among ZnSe, $BaF_2$, NaCl, Si, Ge, CsI or KRS-5) for inputting the excitation laser beam 2 is provided in the vacuum chamber 10. A gate valve 10a is provided at the exit window side where the EUV light 4 reflected by the EUV collector mirror 15 is led out towards the exposure apparatus. The interior of the exposure apparatus is also maintained in a vacuum or reduced pressure state, as in the vacuum chamber 10.

The Sn target 1 is solid tin (Sn). Solid tin may be embodied in various forms, including, for instance, a wire, tape, plate, rod or a spherical shape. With a view to better dissipating heat, a core material coated by tin may also be used. As the core material there can be used, for instance, materials having excellent thermal conductivity, such as copper (thermal conductivity 390 W/mK), tungsten (thermal conductivity 130 W/mK), molybdenum (thermal conductivity 145 W/mK) or the like, or high melting-point materials, such as tungsten (melting point 2382° C.), tantalum (melting point 2996° C.), molybdenum (melting point 2622° C.) or the like. A material having a multilayer structure may also be used as the core material, for instance, a wire for cutting hard materials, obtained by applying a multilayer coating of copper and diamond onto a core wire of stainless steel. As the core material there may also be used a heat pipe having excellent thermal conductivity.

The Sn target 1 is supplied into the vacuum chamber 10 by a target supply device not shown. Similarly, the Sn target 1 is recovered out of the vacuum chamber 10 by a target recovery device not shown. A target position detector 11 (having as a material thereof any among $BK_7$ or $SiO_2$) comprises a position sensor provided with an optical element. By way of such position sensor, the target position detector 11 detects the position of the Sn target 1 supplied into the vacuum chamber 10 by the target supply device. The detection result of the target position detector 11 is outputted to the control unit 30. The control unit 30 controls the target supply device and adjusts a desired position of the target 1.

The $CO_2$ laser 13 is a laser beam source capable of high-repetition rate pulse oscillation (with, for instance, a pulse width of about several nsec to about several tens of nsec, and a frequency of about 1 kHz to about 100 kHz). The laser condensing optical system 14 comprises at least one lens and/or at least one mirror. In FIG. 1, a condensing mirror is depicted as the laser condensing optical system 14 (having as a material thereof any among Cu, Si, Mo or Au). However, the laser condensing optical system 14 may comprise another lens and/or mirror. In FIG. 1, also, the laser condensing optical system 14 is provided inside the vacuum chamber 10, but it may also be provided outside the vacuum chamber 10. The laser condensing optical system 14 is mounted on a driving device controlled by the control unit 30, such that the position of the laser condensing optical system 14 is adjusted through the operation of such a driving device. The laser beam 2 outputted by the $CO_2$ laser 13 strikes the laser condensing optical system 14, and is condensed thereafter onto a predetermined position in the vacuum chamber 10, to irradiate the Sn target 1. The Sn target 1 irradiated by the laser beam 2 becomes partially excited into plasma 3 that emits radiation of various wavelength components.

The EUV collector mirror 15 is a condensing optical system for condensation by selective reflection of predetermined wavelength components (for instance, EUV light in the vicinity of 13.5 nm) from among the various wavelength components emitted by the plasma 3. The EUV collector mirror 15 has a concave reflecting surface. On this reflective surface there is formed, for instance, a multilayer film of silicon (Si) and molybdenum (Mo) for selectively reflecting EUV light having a wavelength in the vicinity of 13.5 nm. In FIG. 1, the EUV light is reflected by the EUV collector mirror 15 towards the right, and is outputted to the exposure apparatus after being condensed at an EUV intermediate condensing point. The condensing optical system of EUV light is not limited to the EUV collector mirror 15 illustrated in FIG. 1, and may comprise plural optical components. The condensing optical system, however, must be configured as a reflection optical system with a view to curbing EUV light absorption.

The EUV light source device further comprises an EUV light power detector 24. The EUV light power detector 24 comprises, for instance, a zirconium (Zr) filter and a photodiode. Other than Zr, the filter material may be Si or Mo. Zirconium filters cut light having a wavelength of 20 nm or above. The photodiode outputs to the control unit 30a detection signal in response to the intensity or energy of incident light.

A vacuum pump 35 is connected to the vacuum chamber 10. The vacuum pump 35 evacuates the vacuum chamber 10 and recovers debris removed from the optical elements in accordance with the various below-described embodiments.

The reason for using solid tin and a $CO_2$ laser in the present invention is that combining solid tin and a $CO_2$ laser causes much of the debris generated by the plasma to consist of sub-nano to nanosize particles (molecular-atomic level). This phenomenon, which was unknown heretofore, constitutes a novel finding discovered by the inventors on the basis of the below-described experiment.

Figure 2:
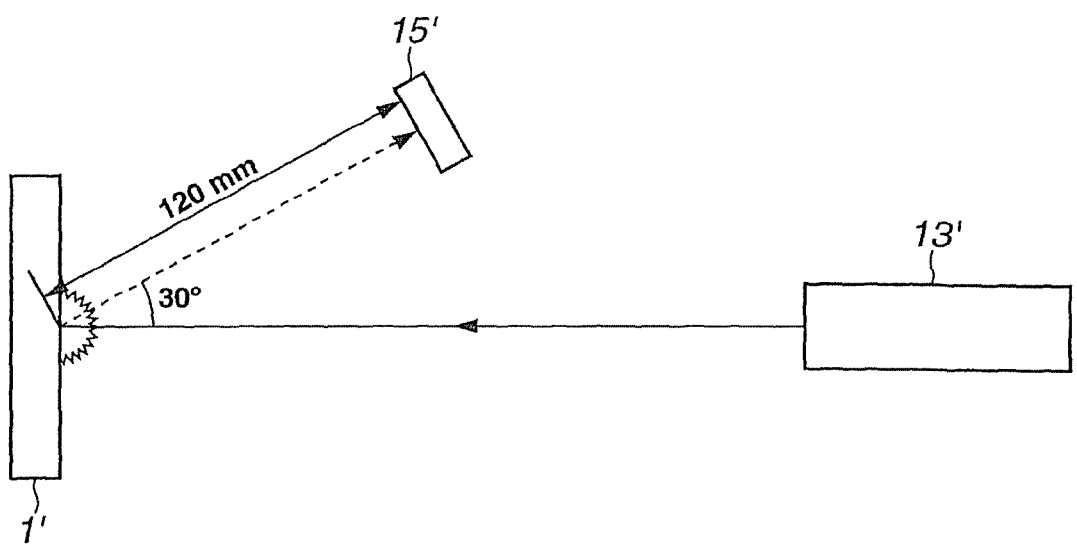
FIG. 2 is a diagram illustrating the device configuration of an experiment carried out by the inventors.

FIG. 2 is a diagram illustrating the configuration of an apparatus in an experiment carried out by the inventors.

This apparatus comprises plate-like tin 1', a TEA-$CO_2$ laser 13' arranged in the perpendicular direction to the surface of the tin 1', and a Mo/Si sample mirror 15' for analysis arranged at a position distant by about 120 mm from the tin, in a direction tilted by about 30 degrees relative to the perpendicular direction to the surface of the tin 1'. The inventors observed that debris became adhered to the Mo/Si sample mirror 15' as a result of irradiating no fewer than 150,000 shots of a laser beam under conditions that sufficiently allows for EUV light emission, with an energy of the TEA-$CO_2$ laser 13' of about 15 to 25 mJ, a pulse duration half width of 10 ns, and a focus spot size of about 100 μm.

Figure 3:
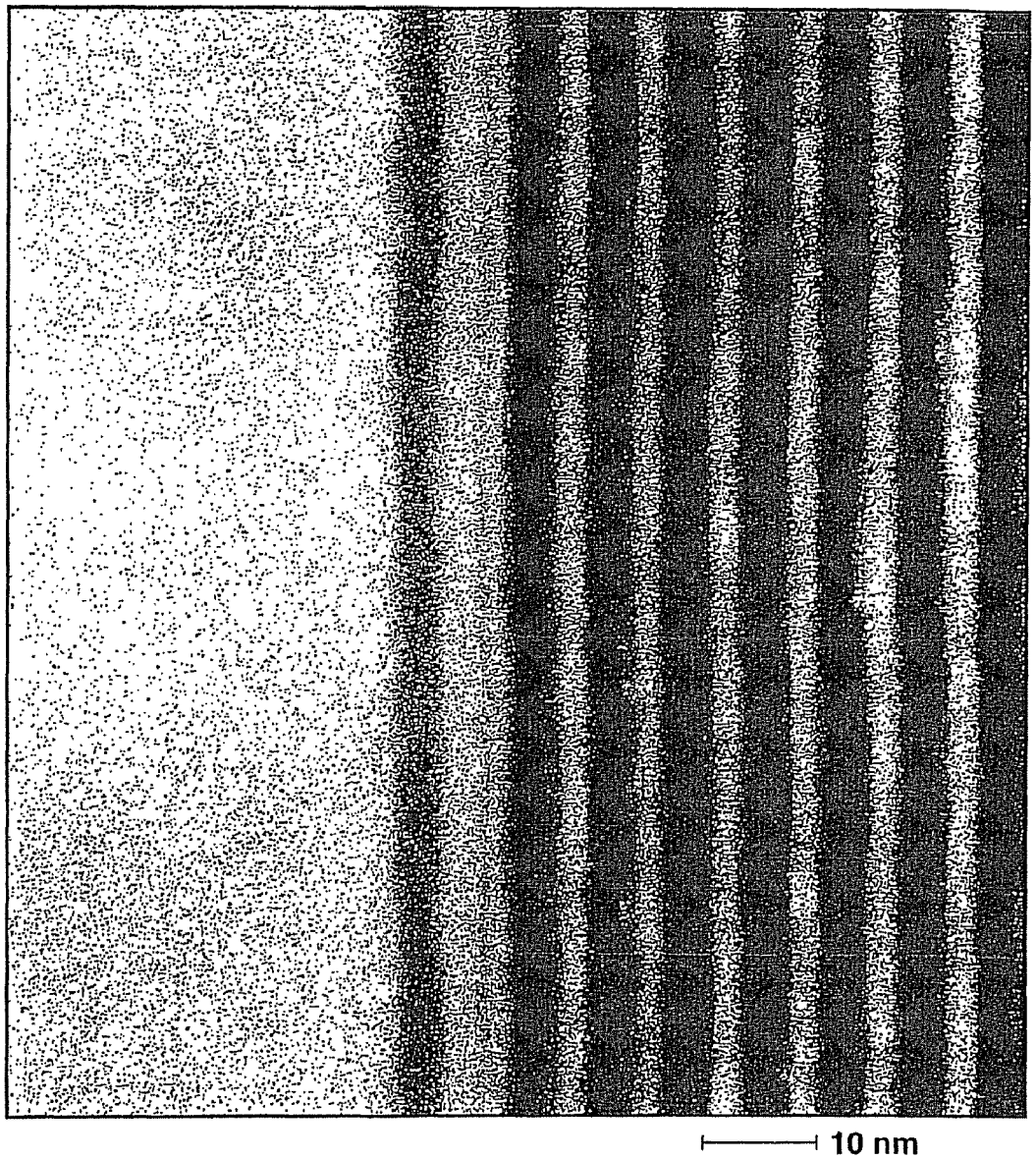
FIG. 3 is a cross-sectional photograph of a metallic film obtained in an experiment carried out by the inventors.
Figure 4:
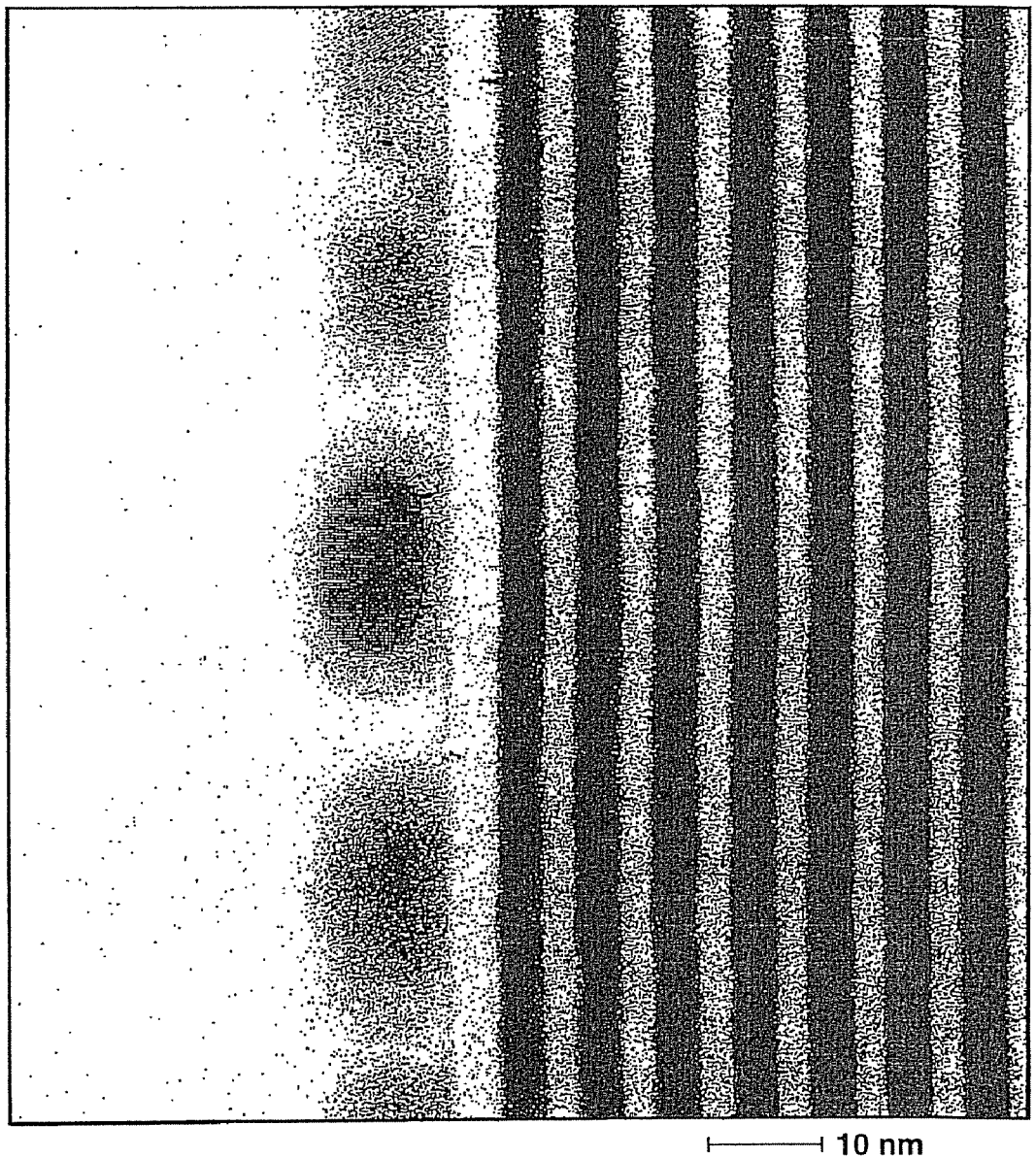
FIG. 4 is a cross-sectional photograph of a metallic film obtained by vacuum vapor deposition.

FIG. 3 is a cross-sectional photograph of a metallic film obtained in an experiment carried out by the inventors. FIG. 4 is a cross-sectional photograph of a metallic film obtained by vacuum vapor deposition. FIG. 4 corresponds to comparative example of the present experiment.

FIG. 3 shows that a metallic film is formed on the surface of the Mo/Si sample mirror 15'. In FIG. 3, however, no particles can be seen adhered to the surface of the Mo/Si sample mirror 15'. On the other hand, when microsize tin is adhered to the sample surface by vacuum vapor deposition, microsize particles can be seen to adhere to the sample surface, as illustrated in FIG. 4. These results indicate that a metallic film formed on the surface of the Mo/Si sample mirror 15' comprises particles of about sub-nano to nanosize, which is smaller than microsize. That is, much of the plasma-generated debris during excitation of solid tin by a $CO_2$ laser is estimated to be of sub-nano to nanosize.

Debris having a small particle size possesses a lesser adherence than debris having a large particle size. When debris is roughly of microsize, the adherence thereof cannot be sufficiently overcome through the effect of physical cleaning. However, it is estimated that the adherence of debris of roughly nanosize can be sufficiently overcome through the effect of physical cleaning. That is, excitation of solid tin by a $CO_2$ laser results in nanosize debris whose adherence can be overcome. This allows, as a result, removing the debris from optical elements by means of small forces, such as those of physical cleaning. Specific embodiments are explained next concerning the effect of overcoming the adherence of nanosize debris.

Example 1

Figure 5:
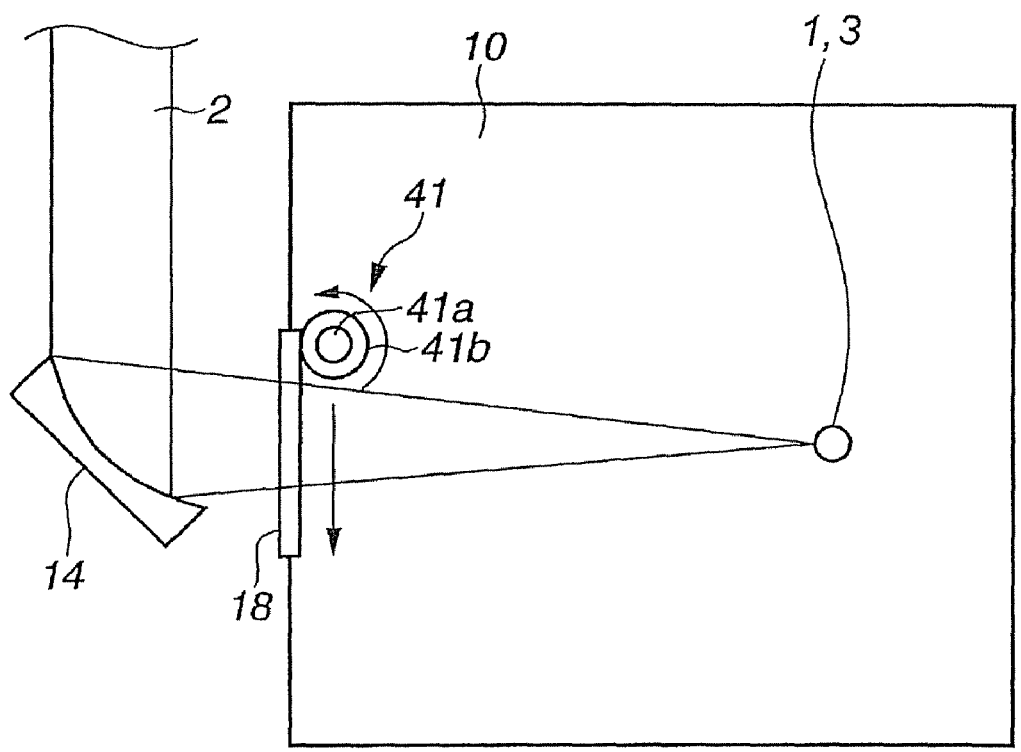
FIG. 5 is a diagram illustrating the constitution of a first embodiment.

FIG. 5 is a diagram illustrating the constitution of a first embodiment. In FIG. 5, features identical to those of FIG. 1 are denoted with identical reference numerals, and the explanation thereof is omitted.

In the present embodiment, the adherence of the nanosize debris adhered to the input window 18 is overcome by wiping the output side surface of the input window 18.

A scrubber 41 is provided in the vicinity of the input window 18 inside the vacuum chamber 10. The scrubber 41 is a rotary brush comprising a brush 41b of a material such as nylon, mohair, PVA (polyvinyl alcohol), PP (polypropylene) or the like, provided around a cylindrical shaft 41a. A driving device not shown causes the scrubber 41 to slide over the input window 18 while rotating around the shaft axis. The scrubber 41 may be a fixed brush instead of a rotary brush.

The scrubber 41 may be imparted a weak chemical cleaning effect by wetting the brush 41b with a cleaning solution, for instance, pure water, weak alkaline water or weak acidic water used in RCA cleaning solutions, ionized water, ozone water or the like. The cleaning effect of the scrubber 41 is enhanced by using a cleaning solution. The cleaning solution must be diluted enough so that the chemical reaction thereof with the optical system is within admissible limits. The chemical reaction of such a cleaning solution with the optical element is thus very weak, and hence the original reflectance and/or transmissivity of the coating and/or the optical substrate is not impaired thereby.

Nanosize debris adhered to the input window 18 is removed by the brush 41b as the scrubber 41 rotates sliding over the surface of the input window 18. In the present embodiment, the cleaning operation is carried out when laser irradiation is discontinued. Repeated cleaning operations cause debris to accumulate in the scrubber 41 itself. Hence, the scrubber 41 itself is preferably replaced or cleaned periodically.

In the present embodiment, thus, excitation of the Sn target 1 by the $CO_2$ laser 13 results in plasma that gives rise to nanosize debris. Nanosize debris has extremely weak adherence, which can be overcome through the wiping action of the scrubber 41. This allows hence removing the debris from the input window 18.

The present embodiment can be applied not only to the cleaning of the input window 18, but also to the cleaning of any optical element in the vacuum chamber 10, for instance the target position detector 11, the laser condensing optical system 14, the EUV collector mirror 15, the SPF 16, the EUV light power detector 24 and so forth illustrated in FIG. 1.

Example 2

Figure 6:
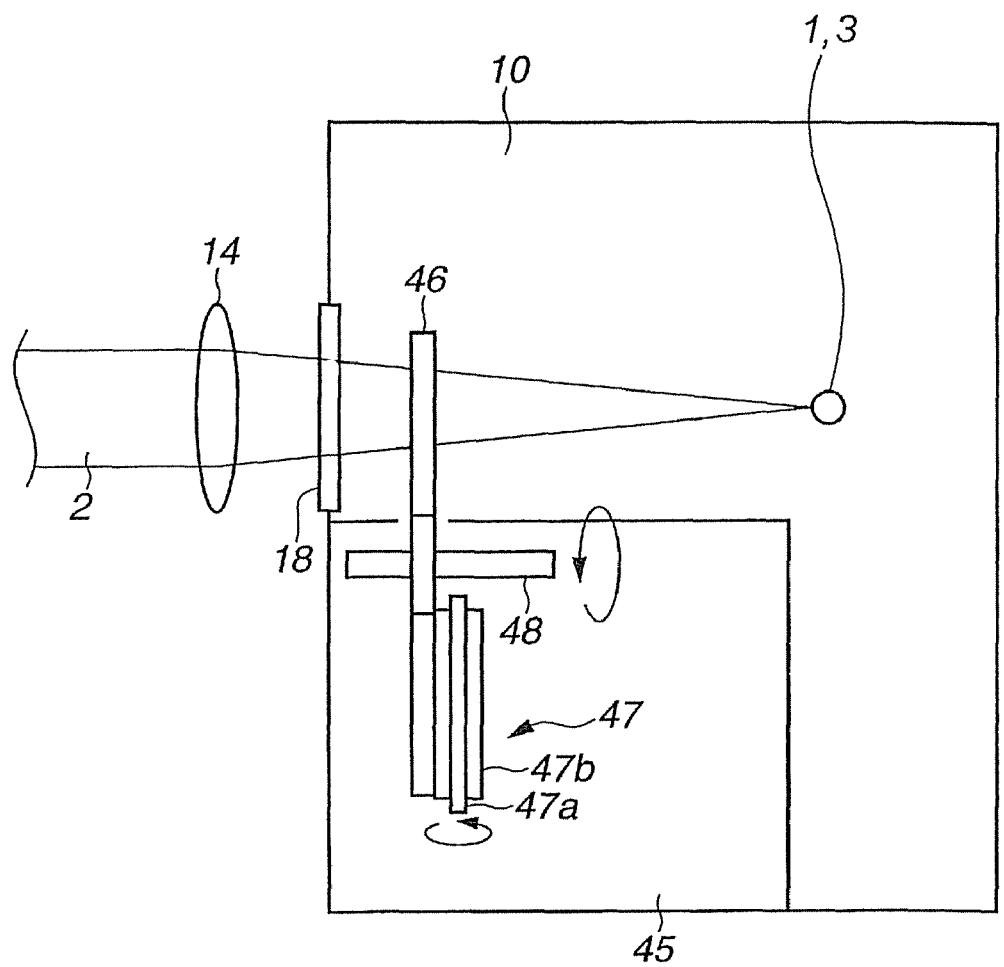
FIG. 6 is a diagram illustrating the constitution of a second embodiment.

FIG. 6 is a diagram illustrating the constitution of a second embodiment. In FIG. 6, features identical to those of FIG. 1 are denoted with identical reference numerals, and the explanation thereof is omitted.

In the present embodiment, the adherence of nanosize debris to a debris protective plate 46 (having as a material thereof any among ZnSe, $BaF_2$, NaCl, Si, Ge, CsI and KRS-5) provided on the output side of the input window 18 is overcome through wiping of the surface of the debris protective plate 46.

A cleaning chamber 45 is partitioned off in the interior of the vacuum chamber 10, in the vicinity of the input window 18, in such a way so as not to hinder the laser beam 2. The debris protective plate 46, shaped as a circular plate, is pivotably supported inside the cleaning chamber 45. The debris protective plate 46 is a transmissive optical element formed of, for instance, zinc selenium (ZnSe), barium fluoride or the like ($BaF_2$) or the like. Part of the debris protective plate 46 is provided out of the cleaning chamber 45, between the input window 18 and the generation region of the plasma 3. The debris protective plate 46 rotates around a rotating shaft 48, such that part of the debris protective plate 46 is made to pass between the input window 18 and the plasma 3. Other than of rotating type, the cleaning chamber 45 may be of sliding type.

A scrubber 47 is provided inside the cleaning chamber 45 in such a way so as to come into contact with the surface of the debris protective plate 46. The scrubber 47 is a rotary brush comprising a brush 47b of a material such as nylon, mohair, PVA (polyvinyl alcohol), PP (polypropylene) or the like, provided around a cylindrical shaft 47a. A driving device not shown causes the scrubber 47 to rotate around the shaft axis. The scrubber 47 may be a fixed brush instead of a rotary brush. The scrubber 47 may be imparted a weak chemical cleaning effect by wetting the brush 47b with a cleaning solution, as in the first embodiment.

Nanosize debris adhered to the debris protective plate 46 is removed by the brush 47b as both the scrubber 47 and the debris protective plate 46 are made to rotate. The cleaning operation in the present embodiment can be carried out also during laser irradiation, so that the laser need not be discontinued. The embodiment is therefore excellent in efficiency.

Also, cleaning is performed in the cleaning chamber 45, which is a separate space apart from other optical elements inside the vacuum chamber 10. This allows preventing debris removed by the debris protective plate 46 from becoming adhered again to other optical elements.

In the present embodiment, thus, excitation of the Sn target 1 by the $CO_2$ laser 13 results in plasma that gives rise to nanosize debris. Nanosize debris has extremely weak adherence, which can be overcome through the wiping action of the scrubber 47. This allows hence removing the debris from the debris protective plate 46.

The present embodiment can be applied not only to the cleaning of the input window 18, but also to the cleaning of the target position detector 11, laser condensing optical system 14 and so forth illustrated in FIG. 1. As the lens material in the laser condensing optical system 14 there can be used, moreover, any material among ZnSe, $BaF_2$, NaCl, Si, Ge, CsI, and KRS-5. The debris protective plate must have high transmissivity when covering the EUV collector mirror 15, SPF 16 or the EUV light power detector 24 illustrated in FIG. 1. At present, however there is no material that satisfies the desired transmissivity, and hence the present embodiment is not suited for such optical elements.

Example 3

Figure 7:
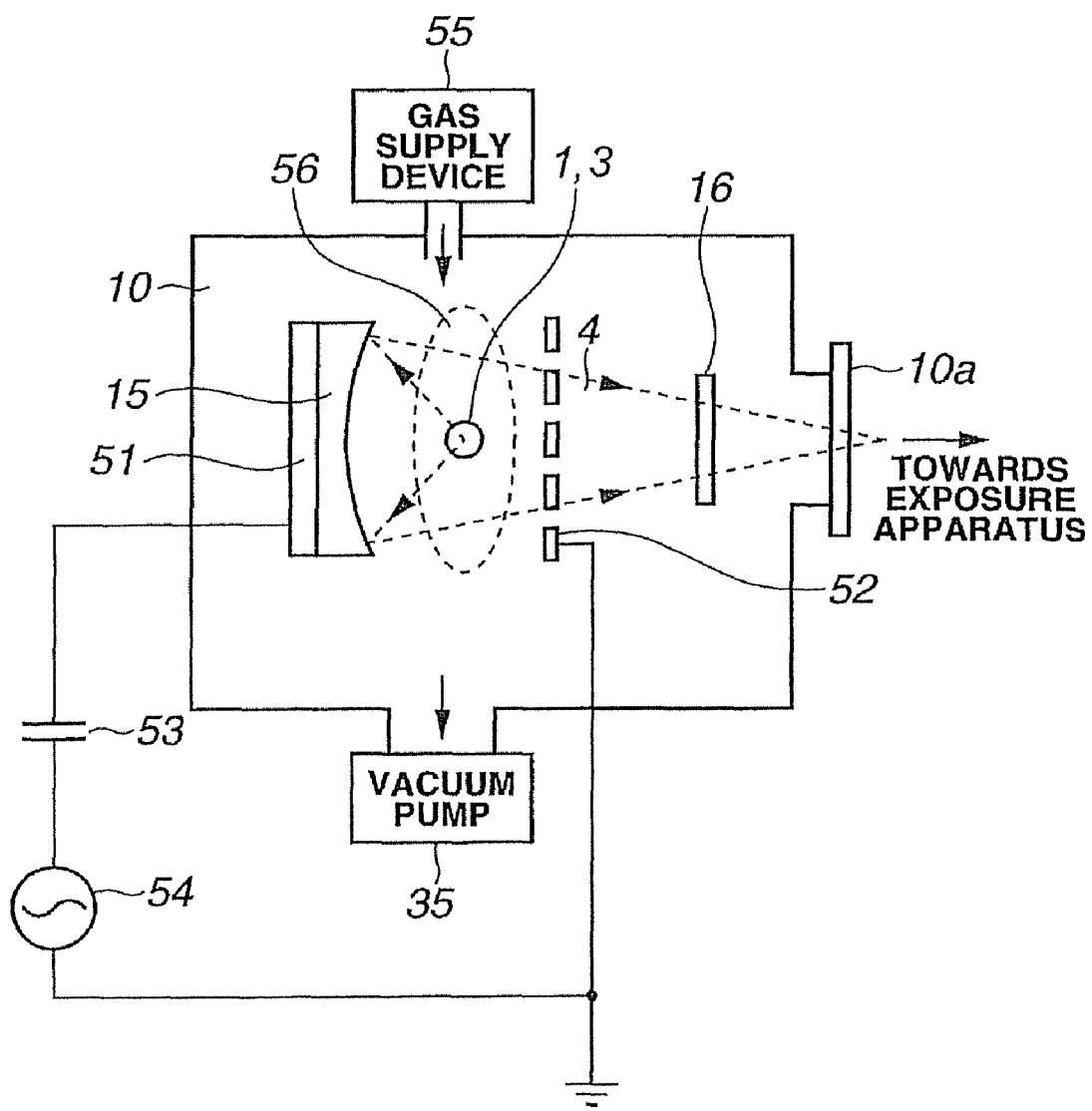
FIG. 7 is a diagram illustrating the constitution of a third embodiment.

FIG. 7 is a diagram illustrating the constitution of a third embodiment. In FIG. 7, features identical to those of FIG. 1 are denoted with identical reference numerals, and the explanation thereof is omitted.

In the present embodiment, the adherence of nanosize debris adhered to the reflective surface of the EUV collector mirror 15 is overcome by sputtering (plasma etching) in which plasma is biased.

Inside the vacuum chamber 10 there are provided a planar electrode 51, comprising a conductive substrate, connected to the rear face of the EUV collector mirror 15, and a grid electrode 52 facing the reflective surface of the EUV collector mirror 15, so as to flank the generation region of the plasma 3. The planar electrode 51 is connected to a 13.56 MHz RF power supply 54 via a blocking capacitor 53. The grid electrode 52 is connected to ground. In such a configuration, the planar electrode 51 is the cathode and the grid electrode 52 is the anode.

A gas supply device 55 is connected to the vacuum chamber 10. The gas supply device 55 supplies a desired amount of etchant gas (Ar gas) into the vacuum chamber 10. The gas supply device 55 comprises a flow control unit, such as a mass flow sensor. The flow control unit controls the flow rate of etchant gas in such a way so as to maintain a predetermined degree of vacuum in the interior of the vacuum chamber 10. The interior of the vacuum chamber 10 is kept at a vacuum no greater than about several Pa.

Application of RF between the planar electrode 51 and the grid electrode 52 causes ionization of Ar gas supplied from the gas supply device 55 and infused between the electrodes 51, 52, to generate as a result Ar plasma 56. Electrons reaching the cathode cause the planar electrode 51 to become negatively charged, since the circuit is broken by the blocking capacitor 53. The Ar ions strike the reflective surface of the EUV collector mirror 15 along a perpendicular electric field generated on account of the cathode effect. The EUV collector mirror 15 is thus physically etched by the Ar ions, which remove the nanosize debris adhered to the reflective surface of the EUV collector mirror 15.

The grid electrode 52 poses little hindrance for condensation of EUV light at the EUV intermediate condensing point.

Therefore, the cleaning operation in the present embodiment can be carried out also during laser irradiation, so that the laser need not be discontinued. The embodiment is thus excellent in efficiency. The anode side may be configured as a plate-like electrode instead of as the grid electrode 52. In that case, there is provided a driving device for causing the plate-like electrode to slide. Such a driving device shifts the plate-like electrode to a position opposite the EUV collector mirror 15 during discontinuation of the operation of the EUV light source device, and withdraws the plate-like electrode in such a way that the latter does not block EUV light, during operation of the EUV light source device.

In the present embodiment, the Ar plasma 56 is generated using CCP (capacitively coupled plasma), but plasma may be generated by other means. Herein there can be used, for instance, ECR (electron cyclotron resonance plasma), HWP (helicon wave plasma), ICP (inductively coupled plasma), SWP (surface wave plasma) or the like.

In the present invention there is carried out physical etching using Ar gas as an etchant gas, but such a physical etching may be combined with chemical etching by adding a chemically reactive gaseous species, such as $H_2$, HBr, $Br_2$, $Cl_2$, HCl or the like, to the Ar gas. Such chemically reactive gaseous species, however, must be diluted enough so that the chemical reaction thereof with the optical system is within admissible limits. The chemical reaction of such chemically reactive gaseous species with the optical element is thus very weak, and hence the original reflectance and/or transmissivity of the coating and/or the optical substrate are not impaired thereby. Adding a chemically reactive gaseous species to the Ar gas allows supplementing the main cleaning, effected through physical etching by etchant plasma ions, with chemical etching, to afford thus an enhanced cleaning effect.

In the present embodiment, thus, excitation of the Sn target 1 by the $CO_2$ laser 13 results in plasma that gives rise to nanosize debris. Nanosize debris has extremely weak adherence, which can be overcome through the sputtering effect of weak Ar ions. It becomes thus possible to remove debris from the EUV collector mirror 15. The etching effect of Ar ions is weak, and hence there occurs virtually no reflectance or transmissivity impairment as is the case in direct etching of substrate surfaces.

The present embodiment can be applied not only to the cleaning of the EUV collector mirror 15, but also to the cleaning of the laser condensing optical system 14, SPF 16 and so forth illustrated in FIG. 1.

Example 4

Figure 8:
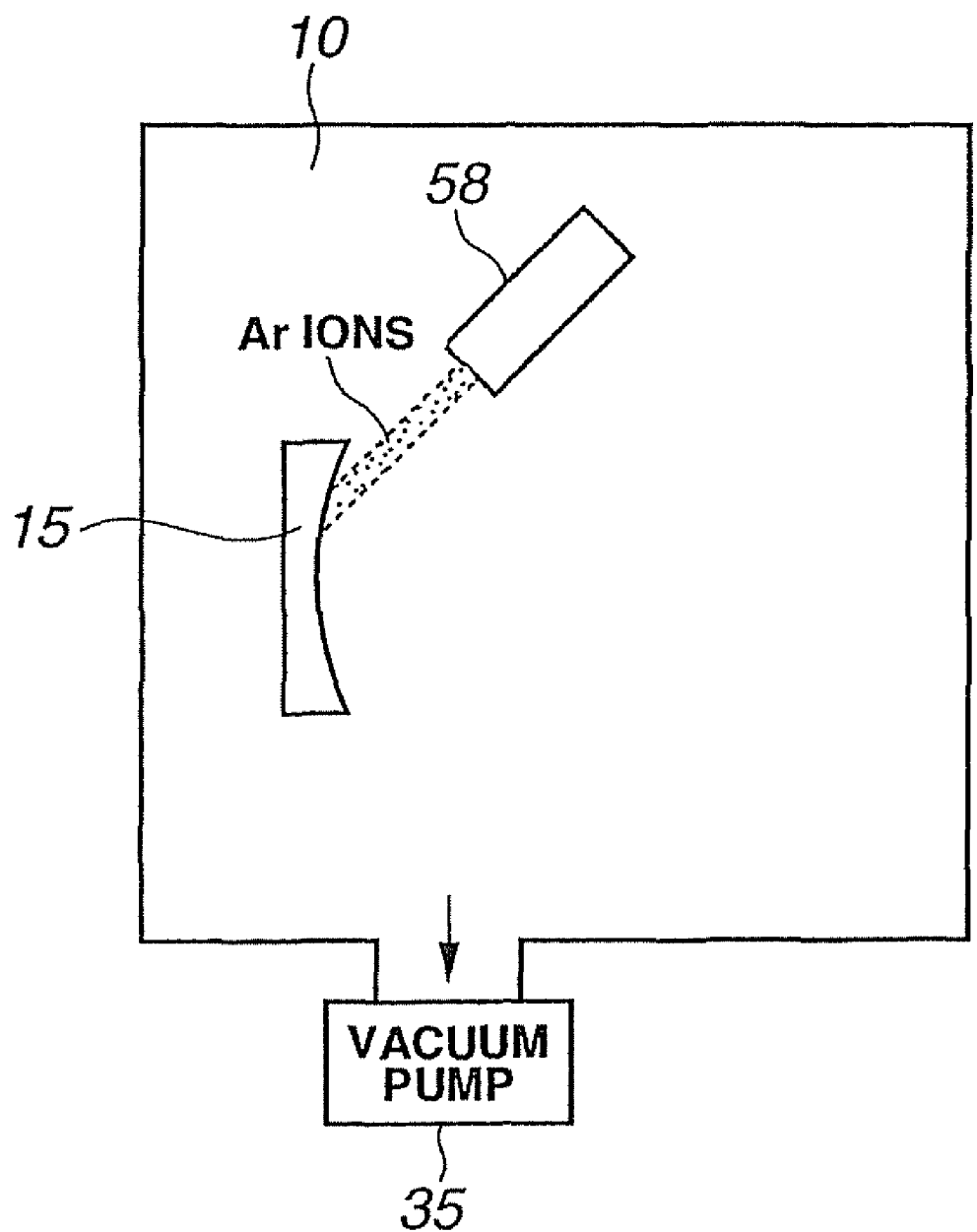
FIG. 8 is a diagram illustrating the constitution of a fourth embodiment.

FIG. 8 is a diagram illustrating the constitution of a fourth embodiment. In FIG. 8, features identical to those of FIG. 1 are denoted with identical reference numerals, and the explanation thereof is omitted.

In the present embodiment, the adherence of nanosize debris adhered to the reflective surface of the EUV collector mirror 15 is overcome by sputtering (ion milling) of accelerated ions.

An ion gun 58 having a beam exit opening thereof facing the reflective surface of the EUV collector mirror 15 is provided inside the vacuum chamber 10. The ion gun 58 irradiates an ion beam of accelerated Ar ions onto the reflective surface of the EUV collector mirror 15, at a predetermined angle. The ion gun 58 moves inside the vacuum chamber 10 in such a way that the ion beam is irradiated uniformly onto the reflective surface of the EUV collector mirror 15.

The Ar ions outputted by the ion gun 58 strike the reflective surface of the EUV collector mirror 15. The EUV collector mirror 15 is thus physically etched by the Ar ions, which remove the nanosize debris adhered to the reflective surface of the EUV collector mirror 15. The cleaning operation in the present embodiment can be carried out also during laser irradiation, so that the laser need not be discontinued. The embodiment is therefore excellent in efficiency.

In the present embodiment, thus, excitation of the Sn target 1 by the $CO_2$ laser 13 results in plasma that gives rise to nanosize debris. Nanosize debris has extremely weak adherence, which can be overcome through the ion milling effect of weak Ar ions. It becomes thus possible to remove debris from the EUV collector mirror 15. The ion milling effect of the Ar ions is thus very weak, and hence the original reflectance and/or transmissivity are virtually unimpaired by direct etching of the substrate surface.

The present embodiment can be applied not only to the cleaning of the EUV collector mirror 15, but also to the cleaning of any optical element in the vacuum chamber 10, for instance the target position detector 11, the laser condensing optical system 14, the SPF 16, the input window 18, the EUV light power detector 24 and so forth illustrated in FIG. 1.

Example 5

Figure 9:
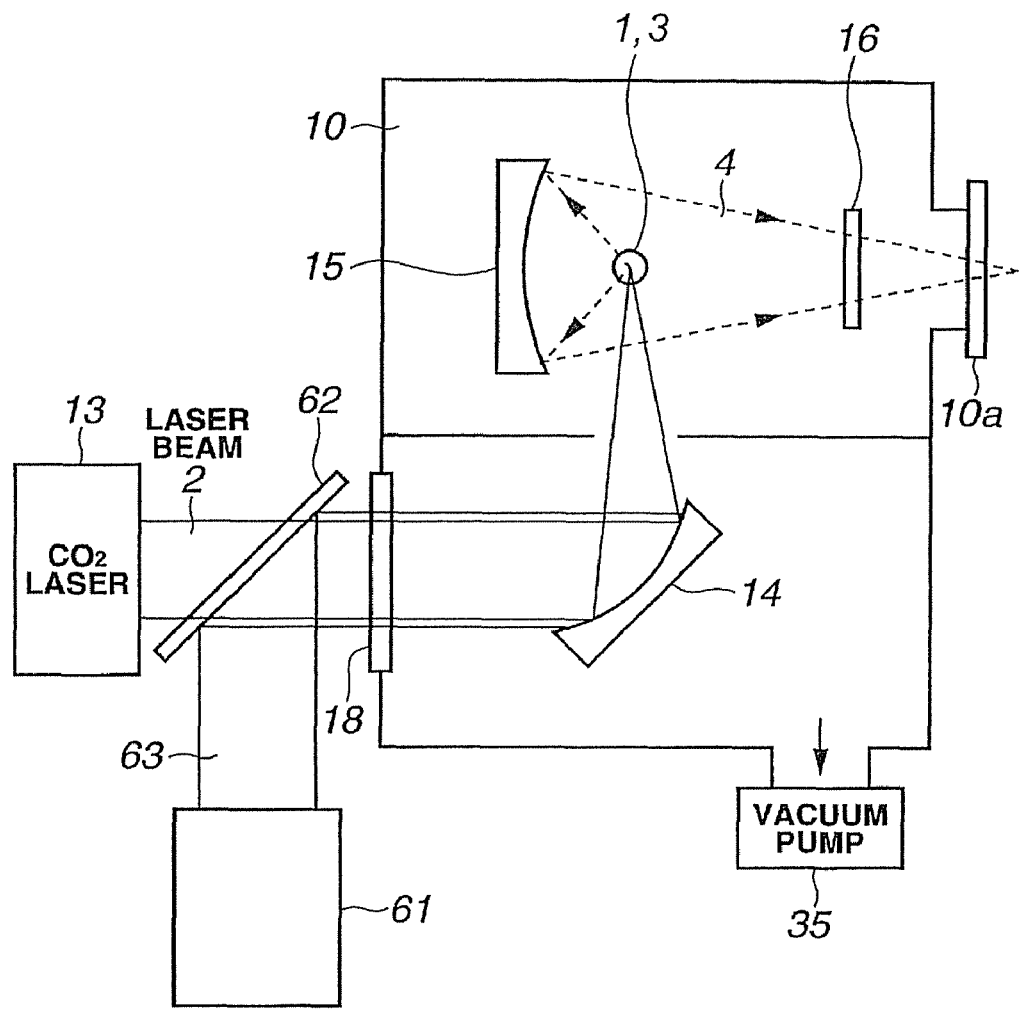
FIG. 9 is a diagram illustrating the constitution of a fifth embodiment.

FIG. 9 is a diagram illustrating the constitution of a fifth embodiment. In FIG. 9, features identical to those of FIG. 1 are denoted with identical reference numerals, and the explanation thereof is omitted.

In the present embodiment, the adherence (van der Waals forces and the like) of the nanosize debris adhered to the input window 18 and the laser condensing optical system 14 is overcome by thermal shock waves generated in response to the irradiation of pulsed layer light.

Outside the vacuum chamber 10 there are provided a pulsed laser 61 that irradiates a laser beam 63 onto the laser condensing optical system 14 via the input window 18, and a beam combiner 62 for inputting into the vacuum chamber 10 the laser beam 63 outputted by the pulsed laser 61 in combination with the laser beam 2 outputted by the $CO_2$ laser 13.

The pulsed laser 61 is appropriately a short-wavelength pulsed laser such as, for instance, a Nd:YAG laser (wavelengths 1064 nm, 512 nm), an excimer laser (wavelengths 248 nm, 193 nm) or the like. In the present embodiment $BaF_2$ is used in the input window 18 that transmits the laser beams 2, 63.

The laser beam 63 outputted by the pulsed laser 61 is reflected by the beam combiner 62, passes through the input window 18, and strikes the laser condensing optical system 14. Irradiation of the laser beam 63 onto the exit surface of the input window 18 and the reflective surface of the laser condensing optical system 14 generates thermal shock waves on such optical elements 18, 14. These shock waves overcome the adherence of the nanosize debris adhered to the optical elements 18, 14.

In the present embodiment, the laser beam 63 strikes the laser condensing optical system 14 via the input window 18. The embodiment is thus superior in that it allows simultaneous cleaning of the input window 18 and the laser condensing optical system 14. However, there may also be provided another input window through which the laser beam 63 strikes the laser condensing optical system 14, in which case there is no need for the beam combiner 62. With a view to optimizing the cleaning effect, there is preferably further provided an optical system for expanding or contracting the laser beam 63 in such a way that the energy density of the laser beam 63 reaches a desired density. Also, a driving device capable of scanning the laser beam 63 may be provided when the cross-sectional surface area of the laser beam 63 is smaller than the cleaning surface area of the input window 18 and/or of the laser condensing optical system 14.

In the present embodiment, thus, excitation of the Sn target 1 by the $CO_2$ laser 13 results in plasma that gives rise to nanosize debris. The adherence of nanosize debris is very weak and can be overcome by the thermal shock wave effect of the pulsed laser light. This allows hence removing the debris from the input window 18 and/or the laser condensing optical system 14.

The present embodiment can be applied not only to the cleaning of the input window 18 and/or the laser condensing optical system 14, but also to the cleaning of any optical element in the vacuum chamber 10, for instance the target position detector 11, the EUV collector mirror 15, the SPF 16, the EUV light power detector 24 and so forth, which are shown in FIG. 1.

Example 6

Figure 10:
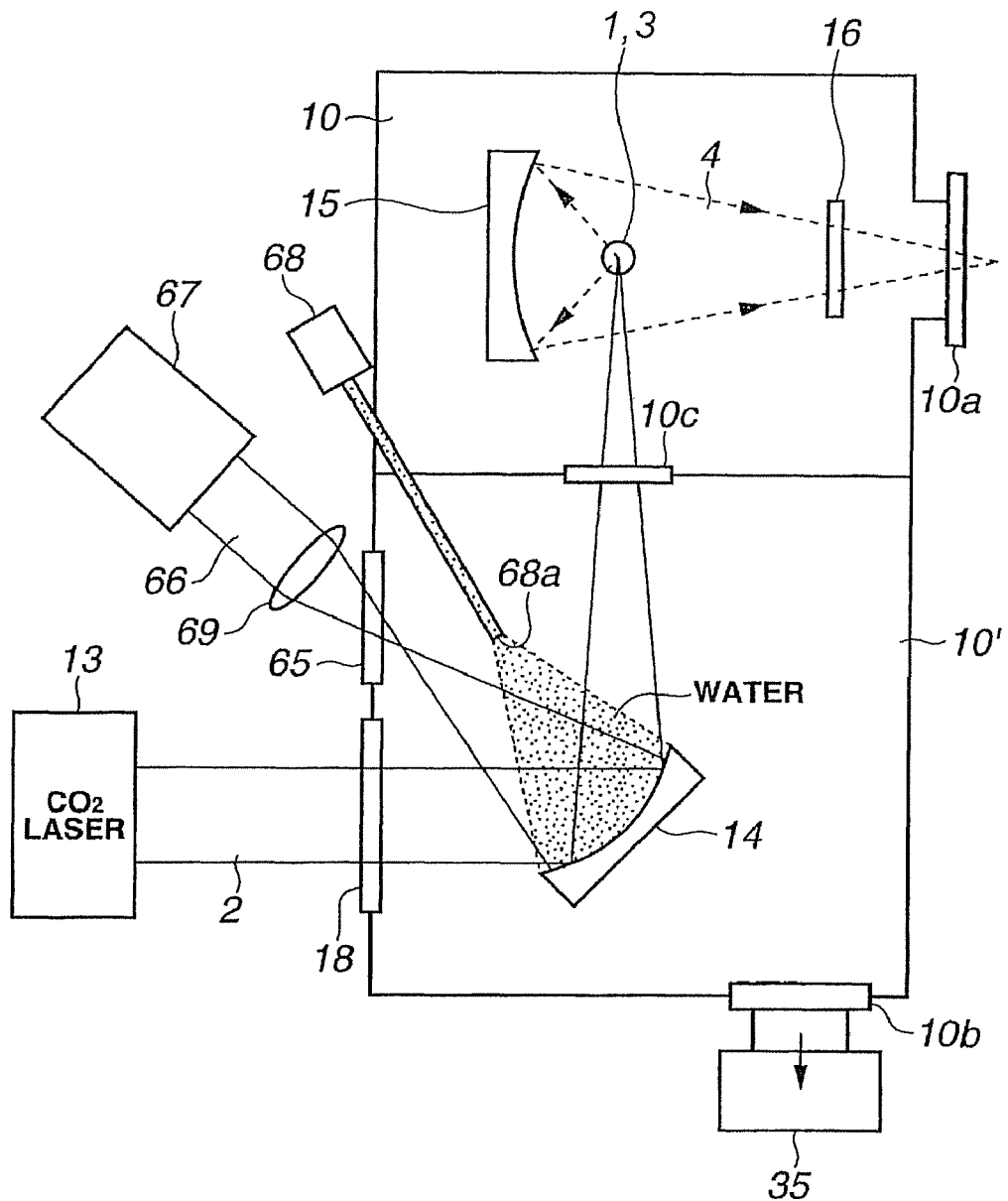
FIG. 10 is a diagram illustrating the constitution of a sixth embodiment.

FIG. 10 is a diagram illustrating the constitution of a sixth embodiment. In FIG. 10, features identical to those of FIG. 1 are denoted with identical reference numerals, and the explanation thereof is omitted.

In the present embodiment, the adherence of nanosize debris adhered to the laser condensing optical system 14 is overcome by forces generated through water evaporation.

An input window 65 is provided in the vacuum chamber 10, for allowing light to pass into and out of the chamber. Outside the vacuum chamber 10 there are provided a pulsed laser 67 that irradiates a laser beam 66 onto the laser condensing optical system 14 via the input window 65, and a water supply device 68 for blowing pure water onto the laser condensing optical system 14 via a spray opening 68a arranged in the vacuum chamber 10. A lens 69 for condensing a laser beam 66 onto the laser condensing optical system 14 is provided between the pulsed laser 67 and the input window 65.

Initially, the vacuum chamber 10 is shut by way of gate valves 10b, 10c. A cleaning chamber 10' is secludedly formed around the laser condensing optical system 14. Next, pure water is blown out of the spray opening 68a of the water supply device 68 onto the laser condensing optical system 14. Alternatively, water vapor is atomized out of the spray opening 68a of the water supply device 68 into the cleaning chamber 10', whereby the interior of the cleaning chamber 10' fills with water vapor. Water wets then the metallic film formed on the surface of the laser condensing optical system 14, seeping into the nanosize debris. In that state, the pulsed laser 67 irradiates the laser beam 66 onto the laser condensing optical system 14. Thereupon, the water on the surface of the laser condensing optical system 14 evaporates instantaneously, so that the forces generated on account of such evaporation overcome the adherence of the nanosize debris.

In the present embodiment, thus, excitation of the Sn target 1 by the $CO_2$ laser 13 results in plasma that gives rise to nanosize debris. The adherence of the nanosize debris is very weak and can be overcome through the effect of the forces generated as a result of water evaporation. This allows hence removing the debris from the laser condensing optical system 14.

The present embodiment can be applied not only to the cleaning of the input window 14, but also to the cleaning of any optical element in the vacuum chamber 10, for instance the target position detector 11, the EUV collector mirror 15, the SPF 16, the input window 18, the EUV light power detector 24 and so forth illustrated in FIG. 1.

Example 7

Figure 11:
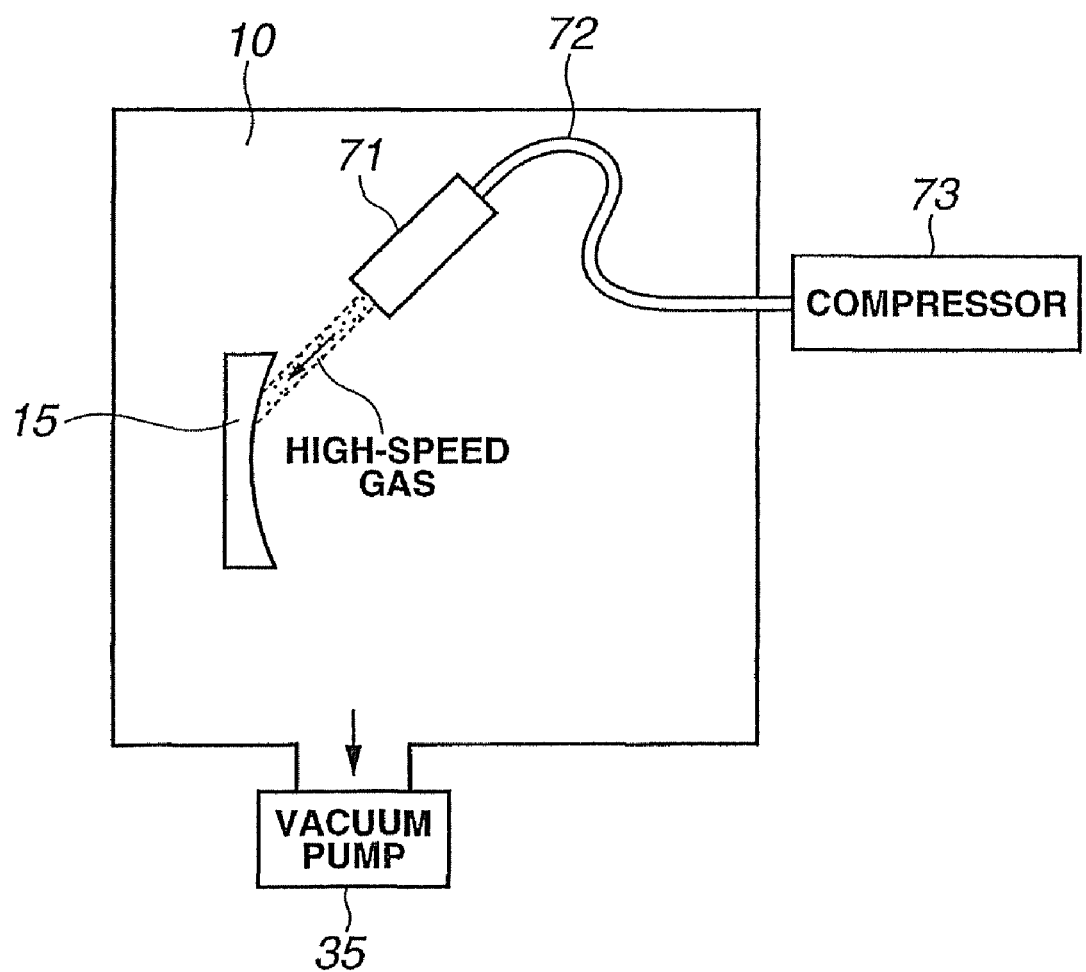
FIG. 11 is a diagram illustrating the constitution of a seventh embodiment.

FIG. 11 is a diagram illustrating the constitution of a seventh embodiment. In FIG. 11, features identical to those of FIG. 1 are denoted with identical reference numerals, and the explanation thereof is omitted.

In the present embodiment, the adherence of the nanosize debris adhered to the EUV collector mirror 15 is overcome through jetting of gas onto the reflective surface of the EUV collector mirror 15.

A gas nozzle head 71 having a jetting opening thereof facing the reflective surface of the EUV collector mirror 15 is provided inside the vacuum chamber 10. The gas nozzle head 71 is connected to a compressor 73 via a flexible duct 72. The compressor 73 compresses an inert gas such as $N_2$, Ar, He or the like, and causes the compressed inert gas to be jetted at high speed, through the gas nozzle head 71, onto the reflective surface of the EUV collector mirror 15. The gas nozzle head 71 moves inside the vacuum chamber 10 in such a way that the inert gas is jetted uniformly onto the reflective surface of the EUV collector mirror 15. Inert gas may also be jetted uniformly onto the reflective surface of the EUV collector mirror 15 by way of plural gas nozzle heads 71. The plural gas nozzle heads 71 may be movable.

The inert gas jetted out of the gas nozzle head 71 is blown at high speed onto the reflective surface of the EUV collector mirror 15. Thereupon, the nanosize debris adhered to the reflective surface of the EUV collector mirror 15 is removed by the jet pressure of the inert gas. The cleaning operation in the present embodiment can be carried out also during laser irradiation, so that the laser need not be discontinued. The embodiment is therefore excellent in efficiency.

In the present embodiment, thus, excitation of the Sn target 1 by the $CO_2$ laser 13 results in plasma that gives rise to nanosize debris. The adherence of the nanosize debris is very weak and can be overcome by the jet effect of the inert gas. It becomes thus possible to remove debris from the EUV collector mirror 15.

The present embodiment can be applied not only to the cleaning of the EUV collector mirror 15, but also to the cleaning of any optical element in the vacuum chamber 10, for instance the target position detector 11, the laser condensing optical system 14, the SPF 16, the input window 18, the EUV light power detector 24 and so forth illustrated in FIG. 1.

Example 8

Figure 12:
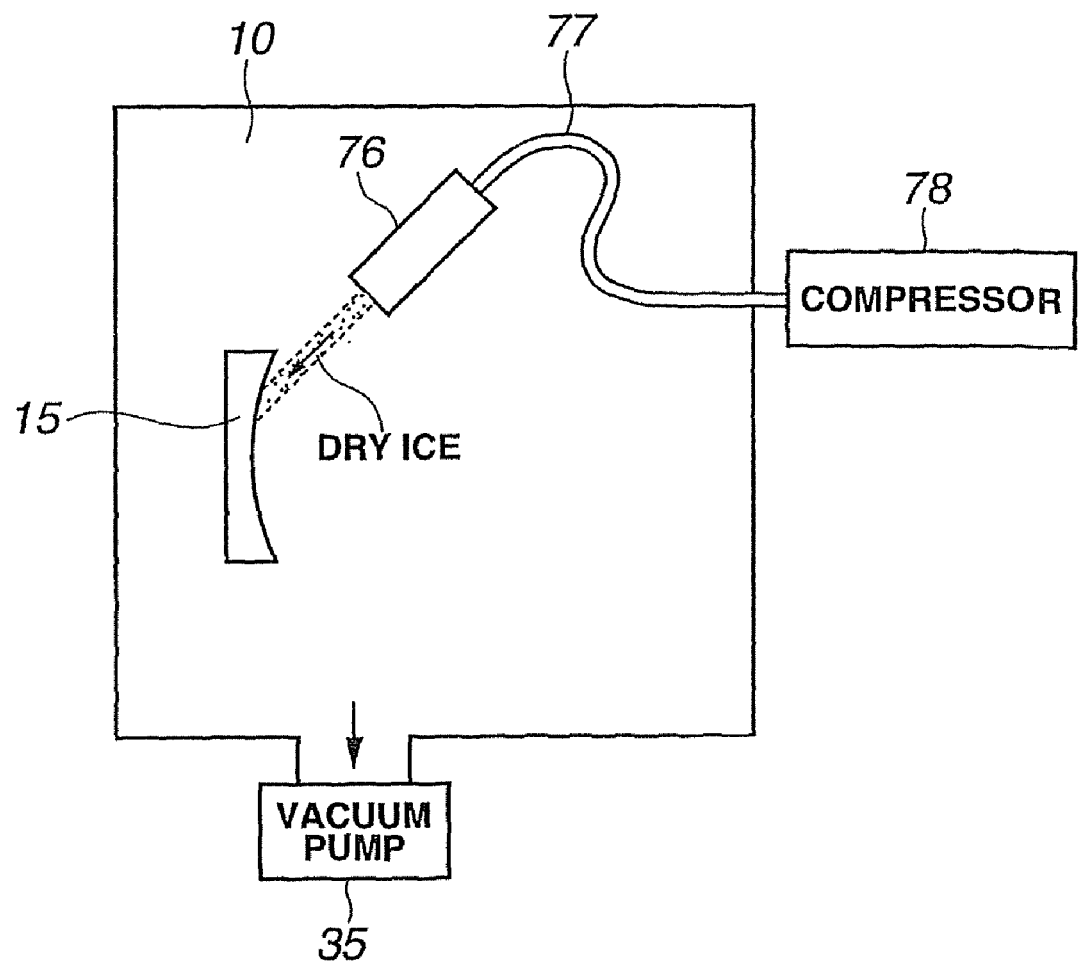
FIG. 12 is a diagram illustrating the constitution of an eighth embodiment.

FIG. 12 is a diagram illustrating the constitution of an eighth embodiment. In FIG. 12, features identical to those of FIG. 1 are denoted with identical reference numerals, and the explanation thereof is omitted.

In the present embodiment, the adherence of the nanosize debris adhered to the EUV collector mirror 15 is overcome through jetting of particles onto the reflective surface of the EUV collector mirror 15.

A dry ice nozzle head 76 having a jetting opening thereof facing the reflective surface of the EUV collector mirror 15 is provided inside the vacuum chamber 10. The dry ice nozzle head 76 is connected to a compressor 78 via a flexible duct 77. The compressor 78 compresses at low temperature a gas such as $CO_2$, $N_2$, Ar or the like, and discharges the low-temperature compressed gas, at high speed, onto the reflective surface of the EUV collector mirror 15, via the dry ice nozzle head 76. The discharged gas becomes a dry ice jet through the effect of adiabatic expansion. The dry ice nozzle head 76 moves inside the vacuum chamber 10 in such a way that the particles are jetted uniformly onto the reflective surface of the EUV collector mirror 15. The particles may be jetted uniformly onto the reflective surface of the EUV collector mirror 15 by plural dry ice nozzle heads 76. The plural dry ice nozzle heads 76 may be movable. The compressor 78 may also be a low-temperature liquid compressor using a liquid such as $CO_2$, $N_2$, Ar or the like.

The dry ice jetted out of the dry ice nozzle head 76 is blown at high speed onto the reflective surface of the EUV collector mirror 15. The nanosize debris adhered to the reflective surface of the EUV collector mirror 15 is removed by the impact of the dry ice particles. The cleaning operation in the present embodiment can be carried out also during laser irradiation, so that the laser need not be discontinued. The embodiment is therefore excellent in efficiency.

In the present embodiment, thus, excitation of the Sn target 1 by the $CO_2$ laser 13 results in plasma that gives rise to nanosize debris. The adherence of the nanosize debris is very weak and can be overcome by the jet effect of the particles. It becomes thus possible to remove debris from the EUV collector mirror 15.

The present embodiment can be applied not only to the cleaning of the EUV collector mirror 15, but also to the cleaning of any optical element in the vacuum chamber 10, for instance the target position detector 11, the laser condensing optical system 14, the SPF 16, the input window 18, the EUV light power detector 24 and so forth illustrated in FIG. 1.

Example 9

Figure 13:
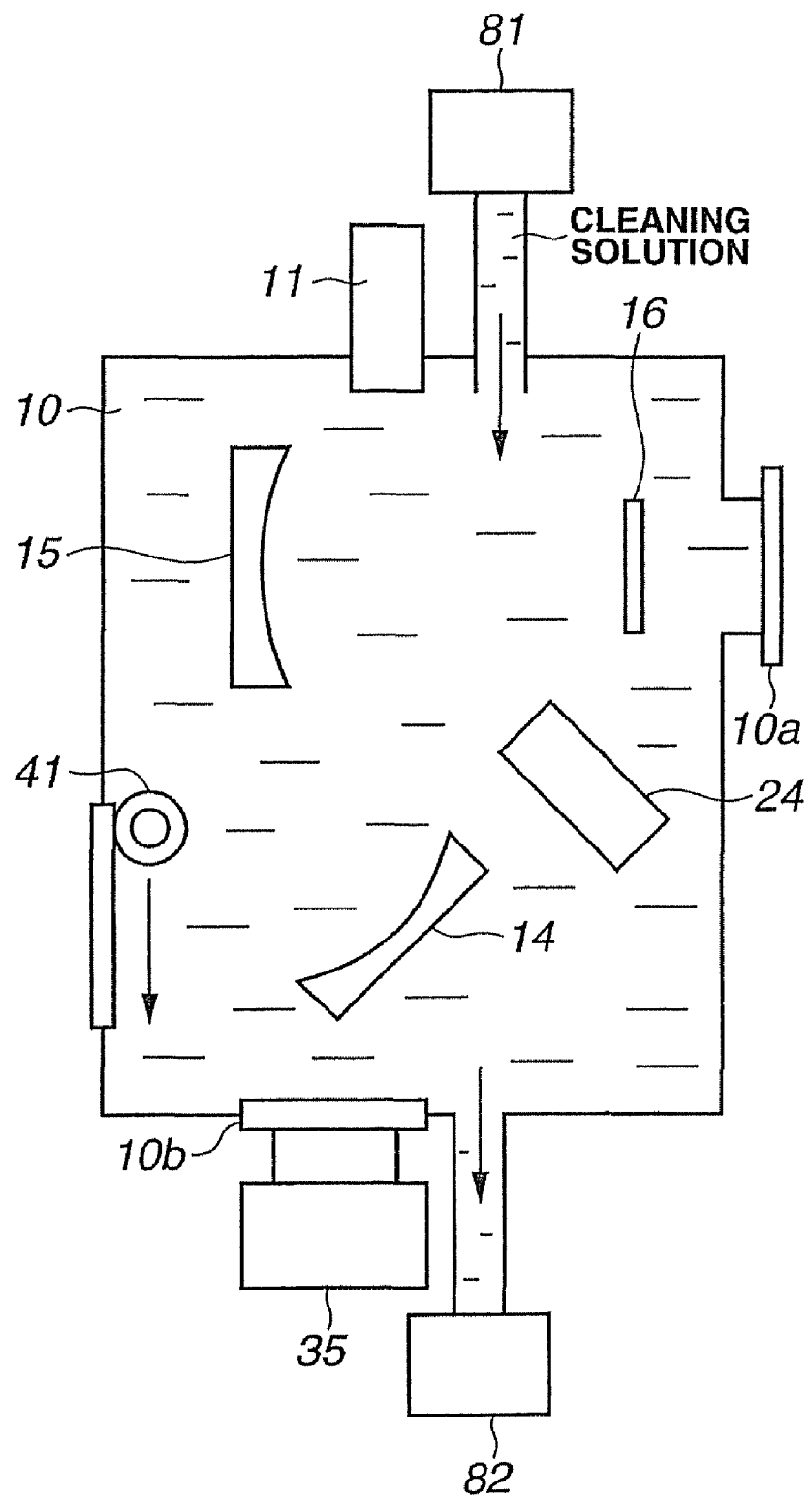
FIG. 13 is a diagram illustrating the constitution of a ninth embodiment.

FIG. 13 is a diagram illustrating the constitution of a ninth embodiment. In FIG. 13, features identical to those of FIG. 1 are denoted with identical reference numerals, and the explanation thereof is omitted.

In the present embodiment, the adherence of the nanosize debris adhered to the various optical elements in the vacuum chamber 10 is overcome by filling the vacuum chamber 10 with a cleaning solution.

In the vacuum chamber 10 there are provided a cleaning solution supply device 81 for supplying cleaning solution into the chamber, and a cleaning solution discharge device 82 for discharging cleaning solution out of the chamber. As the cleaning solution there may be used, for instance, pure water, weak alkaline water or weak acidic water used in RCA cleaning solutions, ionized water, ozone water or the like. The flow of cleaning solution inside the vacuum chamber 10 may be shaped by way of a fluid fan or the like. Providing a scrubber at the surface of each optical element allows also wiping the respective surface. Ultrasound cleaning may also be carried out by providing an ultrasound generator inside the vacuum chamber 10.

Firstly, the various inlet and discharge openings of the vacuum chamber 10 are closed by gate valves 10a, 10b, to isolate the interior of the vacuum chamber 10. Next, cleaning solution is supplied by the cleaning solution supply device 81 into the vacuum chamber 10, to fill the interior of the chamber with cleaning solution. After sufficient time has elapsed for the nanosize debris to be removed from the optical elements, the cleaning solution is discharged out of the vacuum chamber 10 by the cleaning solution discharge device 82. Once discharge of the cleaning solution is over, the gate valves 10a, 10b are opened, to dry the interior of the vacuum chamber 10. The interior of the vacuum chamber 10 may be heated with a baking heater to promote evaporation of the cleaning solution.

In addition to the optical elements in the vacuum chamber 10, the various structures and/or walls of the vacuum chamber 10 can also be cleaned in the present embodiment. This allows, as a result, preventing secondary contamination of the optical elements, i.e. preventing that debris adhered to the structures and/or walls of in the vacuum chamber 10 should detach therefrom to adhere to the optical elements after cleaning of the latter.

In the present embodiment, thus, excitation of the Sn target 1 by the $CO_2$ laser 13 results in plasma that gives rise to nanosize debris. The adherence of the nanosize debris is very weak and can be overcome by the action of the cleaning solution. This allows as a result removing debris from the various optical elements.

Example 10

Figure 14:
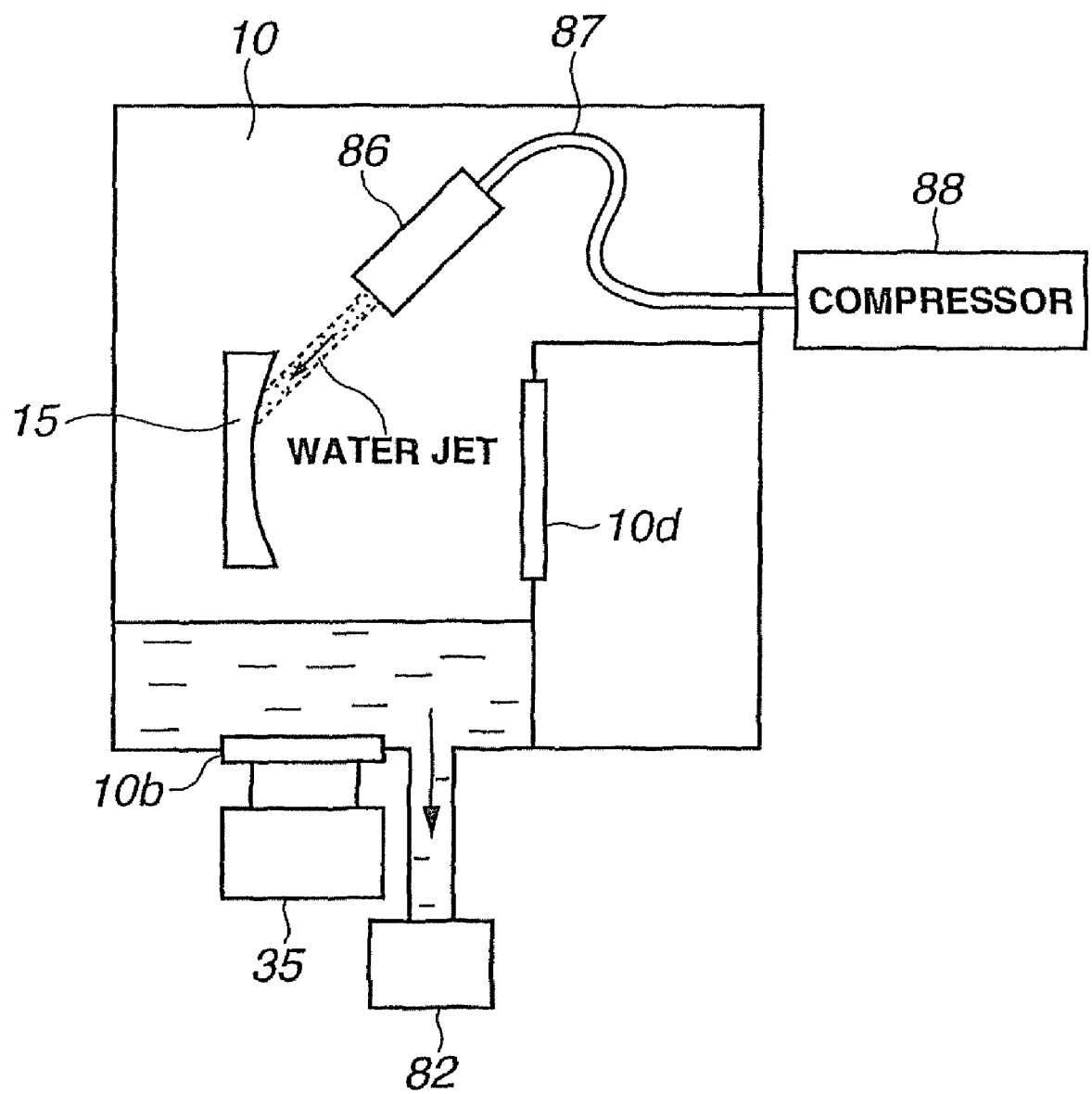
FIG. 14 is a diagram illustrating the constitution of a tenth embodiment.

FIG. 14 is a diagram illustrating the constitution of a tenth embodiment. In FIG. 14, features identical to those of FIG. 1 are denoted with identical reference numerals, and the explanation thereof is omitted.

In the present embodiment, the adherence of the nanosize debris adhered to the EUV collector mirror 15 is overcome through spraying of a cleaning solution onto the reflective surface of the EUV collector mirror 15.

A water nozzle head 86 having a spray opening thereof facing the reflective surface of the EUV collector mirror 15 is provided inside the vacuum chamber 10. A cleaning solution discharge device 82 for discharging cleaning solution out of the interior of the vacuum chamber 10 is also provided. The water nozzle head 86 is connected to a compressor 88 via a flexible duct 87. The compressor 88 sprays a cleaning solution, for instance, pure water, weak alkaline water or weak acidic water used in RCA cleaning solutions, ionized water, ozone water or the like, at high speed, onto the reflective surface of the EUV collector mirror 15, out of the water nozzle head 86. The water nozzle head 86 moves inside the vacuum chamber 10 in such a way that cleaning solution is sprayed uniformly onto the reflective surface of the EUV collector mirror 15. Cleaning solution may also be jetted uniformly onto the reflective surface of the EUV collector mirror 15 by plural water nozzle heads 86. The plural water nozzle heads 86 may be movable. A valve 10d may also be provided for separating the space around the optical elements to be cleaned from the space around other optical elements.

Firstly, the various inlet and discharge openings of the vacuum chamber 10 are closed by way of gate valves 10b, 10d, to isolate the interior of the vacuum chamber 10. Next, cleaning solution is sprayed out of the water nozzle head 86, to be blown at high speed onto the reflective surface of the EUV collector mirror 15. Thereupon, the nanosize debris adhered to the reflective surface of the EUV collector mirror 15 is removed by the spray pressure of the cleaning solution. Once cleaning solution spraying is over, the cleaning solution is discharged out of the interior of the vacuum chamber 10 by the cleaning solution discharge device 82. Once discharge of the cleaning solution is over, the gate valves 10a, 10d are opened, to dry the interior of the vacuum chamber 10. The interior of the vacuum chamber 10 may be heated with a baking heater to promote evaporation of the cleaning solution.

In the present embodiment, thus, excitation of the Sn target 1 by the $CO_2$ laser 13 results in plasma that gives rise to nanosize debris. The adherence of the nanosize debris is very weak and can be overcome by the spraying action of the cleaning solution. It becomes thus possible to remove debris from the EUV collector mirror 15.

The present embodiment can be applied not only to the cleaning of the EUV collector mirror 15, but also to the cleaning of any optical element in the vacuum chamber 10, for instance the target position detector 11, the laser condensing optical system 14, the SPF 16, the input window 18, the EUV light power detector 24 and so forth illustrated in FIG. 1.

Example 11

Figure 15:
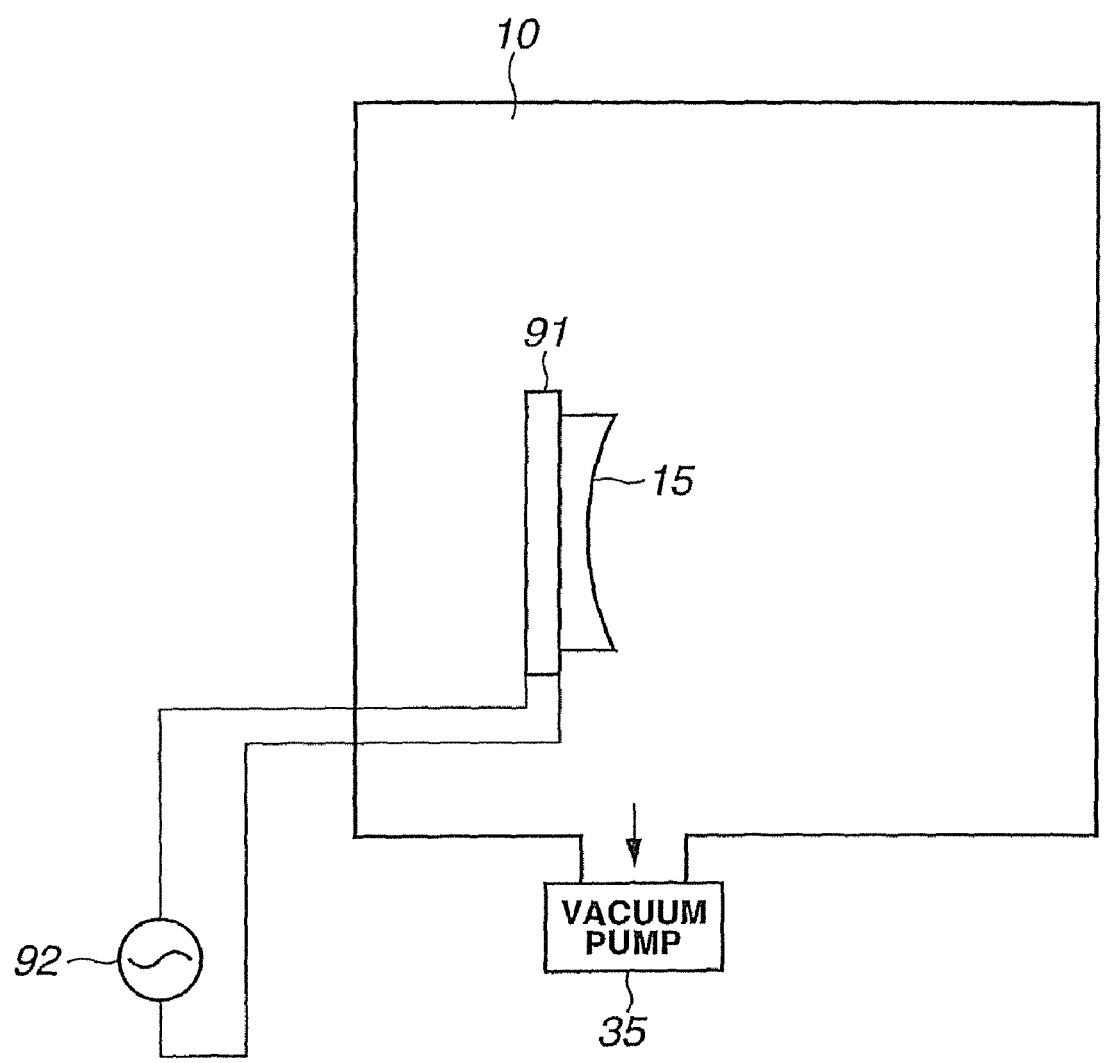
FIG. 15 is a diagram illustrating the constitution of an eleventh embodiment.

FIG. 15 is a diagram illustrating the constitution of an eleventh embodiment. In FIG. 15, features identical to those of FIG. 1 are denoted with identical reference numerals, and the explanation thereof is omitted.

In the present embodiment, the adherence of nanosize debris adhered to the EUV collector mirror 15 is overcome by ultrasonic vibration.

A piezoelectric vibrator 91 is mounted on the rear face of the EUV collector mirror 15. The piezoelectric vibrator 91 is connected to an AC power supply 92. The piezoelectric vibrator 91 converts electric energy supplied by the AC power supply 92 into ultrasound vibration that is imparted to the EUV collector mirror 15.

In the present embodiment, thus, excitation of the Sn target 1 by the $CO_2$ laser 13 results in plasma that gives rise to nanosize debris. The adherence of the nanosize debris is very weak and can be overcome through the ultrasonic vibration effect. It becomes thus possible to remove debris from the EUV collector mirror 15.

The present embodiment can be applied not only to the cleaning of the EUV collector mirror 15, but also to the cleaning of any optical element in the vacuum chamber 10, for instance the target position detector 11, the laser condensing optical system 14, the SPF 16, the input window 18, the EUV light power detector 24 and so forth illustrated in FIG. 1.

The cleaning effect can be enhanced by appropriately combining the above-described first to eleventh embodiments. The third to eleventh embodiments may be employed for cleaning a debris protective plate such as the one explained in the second embodiment.

What is claimed is:

1. An optical element cleaning device for an extreme ultraviolet light source device for removing, from the optical element in a chamber, scattered matter generated together with extreme ultraviolet light by plasma formed through laser beam excitation of a target in the chamber, wherein
    tin is used as the target,
    a $CO_2$ laser is used as an excitation source of the tin, and
    the optical element cleaning device comprises cleaning means for imparting, to nanosize scattered matter adhered to the optical element generated by plasma formed through excitation of the tin by the $CO_2$ laser, an effect of overcoming the adherence of the scattered matter, and
    the cleaning means comprises a liquid cleaning solution supply device adapted to fill a space where the optical element is disposed with a liquid cleaning solution, and a liquid cleaning solution discharge device adapted to discharge the liquid cleaning solution from the space.

2. The optical element cleaning device for an extreme ultraviolet light source device as claimed in claim 1, wherein
    the optical element comprises a transmissive protective plate, provided between a plasma generation region and other optical element in such a way so as to cover the other optical element, for preventing scattered matter from adhering to the other optical element.

3. The optical element cleaning device as claimed in claim 1, wherein the liquid cleaning solution comprises at least one of pure water, weak alkaline water or weak acidic water used in a cleaning solution, ionized water, and ozone water.

4. The optical element cleaning device as claimed in claim 1, wherein cleaning means further comprises at least one valve adapted to isolate the space.

5. The optical element cleaning device as claimed in claim 1, wherein the cleaning means further comprises a heater adapted to promote evaporation of the cleaning solution.

6. A method for cleaning, with an optical element cleaning device, an optical element of an extreme ultraviolet light source device for removing, from the optical element in a chamber, scattered matter generated together with extreme ultraviolet light by plasma formed through laser beam excitation of a target in the chamber,
    the method comprising:
    making the scattered matter generated by the plasma no larger than nanosize by using tin as the target and using a $CO_2$ laser as an excitation source of the tin; and
    imparting, to the scattered matter no larger than nanosize adhered to the optical element, an effect of overcoming the adherence of the scattered matter;
    the optical element cleaning device comprising cleaning means for imparting, to nanosize scattered matter adhered to the optical element generated by plasma formed through excitation of the tin by the $CO_2$ laser, an effect of overcoming the adherence of the scattered matter,
    the cleaning means comprising a liquid cleaning solution supply device adapted to fill a space where the optical element is disposed with a liquid cleaning solution, and a liquid cleaning solution discharge device adapted to discharge the liquid cleaning solution from the space.

* * * * *